US012808906B2

(12) United States Patent
Liu et al.

(10) Patent No.: US 12,808,906 B2
(45) Date of Patent: Nov. 24, 2026

(54) CURRENT SENSOR

(71) Applicant: MultiDimension Technology Co., Ltd., Zhangjiagang (CN)

(72) Inventors: Mingfeng Liu, Zhangjiagang (CN); Ran Shi, Zhangjiagang (CN); Songsheng Xue, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 320 days.

(21) Appl. No.: 18/723,360

(22) PCT Filed: Nov. 17, 2022

(86) PCT No.: PCT/CN2022/132433
§ 371 (c)(1),
(2) Date: Jan. 15, 2025

(87) PCT Pub. No.: WO2023/116277
PCT Pub. Date: Jun. 29, 2023

(65) Prior Publication Data

US 2025/0189563 A1 Jun. 12, 2025

(30) Foreign Application Priority Data

Dec. 21, 2021 (CN) ......................... 202111569931.X

(51) Int. Cl.
*G01R 15/20* (2006.01)
*G01R 15/14* (2006.01)
(Continued)

(52) U.S. Cl.
CPC ......... *G01R 15/205* (2013.01); *G01R 15/146* (2013.01); *G01R 15/18* (2013.01); *G01R 19/0092* (2013.01)

(58) Field of Classification Search
CPC .... G01R 15/205; G01R 15/146; G01R 15/18; G01R 19/0092
See application file for complete search history.

(56) References Cited

U.S. PATENT DOCUMENTS

| | | | |
|---|---|---|---|
| 8,952,687 | B2 | 2/2015 | Tamura |
| 11,397,225 | B2 | 7/2022 | Saito et al. |

(Continued)

FOREIGN PATENT DOCUMENTS

| | | | |
|---|---|---|---|
| CN | 103080755 A | 5/2013 | |
| CN | 206311652 U | 7/2017 | |

(Continued)

OTHER PUBLICATIONS

"Chinese Application No. 202111569931.X, Notification to Grant Patent Right for Invention dated Mar. 17, 2023", (Mar. 17, 2023), 2 pgs.

(Continued)

*Primary Examiner* — Paresh Patel
(74) *Attorney, Agent, or Firm* — Schwegman Lundberg & Woessner, P.A.

(57) ABSTRACT

A current sensor comprises a to-be-measured current input component composed of a first current shunting copper bar, a second current shunting copper bar and a differential copper bar that are arranged in the same direction respectively; and a signal output component composed of a substrate and a magnetic induction module fixed on the substrate. The signal output component is electrically isolated from said current input component. Current to be measured flows through a cross section perpendicular to the first current shunting copper bar, the second current shunting copper bar, and the differential copper bar, and generates a magnetic field at the position of the magnetic induction module. The magnetic induction module at least comprises a first magnetic induction unit and a second magnetic (Continued)

induction unit. The two magnetic induction units are located between the different copper bar and the first current shunting copper bar, sense, in a differential manner, a differential mode magnetic field generated by said current input component, and generate a differential voltage signal to form an output signal of the current sensor. Thus high precision, adjustable and large current measurement range of the advantage of this current sensor are realized.

11 Claims, 6 Drawing Sheets

(51) Int. Cl.
*G01R 15/18* (2006.01)
*G01R 19/00* (2006.01)

(56) References Cited

U.S. PATENT DOCUMENTS

| | | | | |
|---|---|---|---|---|
| 2012/0062224 | A1 | 3/2012 | Ide et al. | |
| 2012/0187943 | A1* | 7/2012 | Ausserlechner | G01R 33/06 324/244 |
| 2013/0154631 | A1 | 6/2013 | Tamura | |
| 2014/0103918 | A1* | 4/2014 | Nomura | G01R 15/205 324/244 |
| 2015/0204916 | A1* | 7/2015 | Akimoto | G01R 15/207 702/64 |
| 2015/0245534 | A1* | 8/2015 | Seo | G01R 15/207 361/689 |
| 2017/0285076 | A1* | 10/2017 | Okuyama | G01R 33/093 |
| 2018/0143226 | A1 | 5/2018 | Futakuchi et al. | |
| 2019/0219616 | A1 | 7/2019 | Cadugan et al. | |
| 2021/0239774 | A1 | 8/2021 | Saito et al. | |
| 2022/0091161 | A1* | 3/2022 | Houis | G01R 15/202 |
| 2022/0317210 | A1 | 10/2022 | Saito et al. | |
| 2025/0052790 | A1* | 2/2025 | Liu | G01R 15/148 |
| 2025/0067780 | A1* | 2/2025 | Liu | G01R 15/207 |
| 2025/0164532 | A1* | 5/2025 | Liu | G01R 15/207 |

FOREIGN PATENT DOCUMENTS

| | | | |
|---|---|---|---|
| CN | 209446649 | U | 9/2019 |
| CN | 111693751 | A | 9/2020 |
| CN | 113203885 | A | 8/2021 |
| CN | 114217114 | A | 3/2022 |
| WO | WO-2015133621 | A1 | 9/2015 |
| WO | WO-2023116277 | A1 | 6/2023 |

OTHER PUBLICATIONS

"International Application No. PCT/CN2022/132433, International Search Report and Written Opinion mailed Feb. 15, 2023", (Feb. 15, 2023), 19 pgs.

* cited by examiner

CURRENT SENSOR

PRIORITY CLAIM TO RELATED APPLICATIONS

This application is a U.S. national stage filing under 35 U.S.C. § 371 from International Application No. PCT/CN2022/132433, filed on 17 Nov. 2022, and published as WO2023/116277 on 29 Jun. 2023, which claims the benefit under 35 U.S.C. 119 to Chinese Application No. 202111569931.X, filed on 21 Dec. 2021, the benefit of priority of each of which is claimed herein, and which applications and publication are hereby incorporated herein by reference in their entirety.

FIELD OF THE INVENTION

Embodiments of the present invention relate to the technical field of electrical measurement, and in particular to a current sensor.

BACKGROUND ART

Current sensors are a type of current detection devices that can convert the detected information of a to-be-measured current into an electrical signal or other forms of signals that meet certain standard requirements. These signals are then used to meet the needs of information transmission, processing, storage, display, recording, and control. Currently, current sensors are widely used in household appliances, smart grids, electric vehicles, wind power generation, and other fields.

Current sensors include magnetic current sensors such as Hall current sensors, fluxgate current sensors, and magnetoresistive current sensors. Hall current sensors are the most mature in terms of technology, but their defects such as low sensitivity, poor temperature drift characteristics, and narrow bandwidth limit applications thereof in high-precision current measurement scenarios. Fluxgate current sensors have good linearity, high detection accuracy, and good temperature drift performance, but their large size, narrow bandwidth, complex circuitry, and high cost limit uses thereof to situations with no high requirements for size. Magnetoresistive current sensors are a promising new type of current sensors with characteristics such as small size, large signal amplitude, high sensitivity, low noise, and easy integration with semiconductor circuits, which can simplify the design of the back-end signal processing circuit, reduce the overall size of the current sensor, and lower the cost.

However, existing magnetoresistive current sensors, especially small chip-level magnetoresistive current sensors, have a limited current measurement range due to high detection precision. That is, magnetoresistive current sensors with high sensitivity generally have a small saturation field, making them prone to magnetic saturation when measuring large currents. For example, Allegro's ACS70331 integrated GMR current sensor includes a bridge structure composed of GMR and can sense the magnetic field generated in the opposite direction by a to-be-measured current through a single-layer U-shaped copper conduction path, that is, this magnetic field is directly used as an input signal of the bridge, which significantly limits the current sensor's scope of use and its measurement range can consequently only reach 2.5 A. For chip-level Hall current sensors with low sensitivity but high saturation fields, such as Allegro's ACS710, CrossChip Microsystems' CC6920, and Melexis' MLX91221, the measurement range of the current sensors is at most tens of amperes when using a single-layer U-shaped copper conduction path. Even when the U-shaped copper conduction path is replaced by a rectangular copper busbar path, such as in Allegro's ACS756, the current sensors' measurement range does not exceed 200 A.

SUMMARY OF THE INVENTION

Embodiments of the present invention provide a current sensor to solve the problem that existing current sensors with high precision and small size have a small measurement range.

Embodiments of the present invention provide a current sensor, comprising:

a to-be-measured current input component, composed of a first current shunting copper bar, a second current shunting copper bar, and a differential copper bar arranged between the first current shunting copper bar and the second current shunting copper bar, the first current shunting copper bar, the second current shunting copper bar, and the differential copper bar being arranged in the same direction; and a signal output component that is electrically isolated from said to-be-measured current input component and comprises a magnetic induction module and a substrate, the magnetic induction module being fixed on the substrate;

wherein a current to be measured flows through a cross section perpendicular to the first current shunting copper bar, the second current shunting copper bar, and the differential copper bar, and generates a magnetic field at the position of the magnetic induction module;

the magnetic induction module at least comprises a first magnetic induction unit and a second magnetic induction unit, the first magnetic induction unit and the second magnetic induction unit are located between the differential copper bar and the first current shunting copper bar, and the first magnetic induction unit and the second magnetic induction unit sense, in a differential manner, a differential mode magnetic field generated by said to-be-measured current input component, and generate a differential voltage signal to form an output signal of the current sensor.

The embodiments of the present invention further provide a current sensor, comprising:

a to-be-measured current input component, composed of a first current shunting copper bar and a second current shunting copper bar that are connected in parallel; and a signal output component that is electrically isolated from said to-be-measured current input component and comprises a magnetic induction module and a substrate, the magnetic induction module being fixed on the substrate;

wherein a current to be measured flows through a cross section perpendicular to the first current shunting copper bar and the second current shunting copper bar, and generates a magnetic field at the position of the magnetic induction module;

the magnetic induction module at least comprises a first magnetic induction unit and a second magnetic induction unit, the first magnetic induction unit is located between the first current shunting copper bar and the second current shunting copper bar, the first magnetic induction unit and the second magnetic induction unit are located on the same horizontal plane, the horizontal plane is parallel to the plane where the substrate is located, and in a direction perpendicular to the plane where the substrate is located, the vertical projection overlapping area of the first current shunting copper bar and the second current shunting copper bar on the plane where the substrate is located does not overlap with the second magnetic induction unit; and the first magnetic induction unit and the second magnetic induction unit sense, in a differential manner, a magnetic field generated by said to-be-measured current input component, and generate a differential voltage signal to form an output signal of the current sensor.

The current sensor provided by the embodiments of the present invention is a novel current sensor, which can control common mode magnetic field working points, and can solve the problem that magnetoresistive sensitive elements are prone to saturation, thereby addressing the limitations by high accuracy to the measurement current range in existing current sensors. Moreover, the structure of the current sensor provided by the embodiments of the present invention is applicable to small-volume current sensor chips, which realizes the high accuracy and adjustable current measurement range of current sensors, can be applied to various different working ranges, and achieves advantages of simple structure, strong resistance to external magnetic field interference, capability of measuring large DC and AC currents, input and output electrical isolation, good linearity, high accuracy, good stability, small volume, and wide range.

BRIEF DESCRIPTION OF THE DRAWINGS

In order to more clearly illustrate the technical solutions in the embodiments of the present invention or the prior art, the accompanying drawings that need to be used in the embodiments or the prior art are briefly introduced below. Obviously, although the accompanying drawings described below are some specific embodiments of the present invention, for those skilled in the art, the basic concepts of the device structure, the driving method, and the manufacturing method disclosed and prompted by the various embodiments of the present invention can be expanded and extended to other structures and drawings, and there is no doubt that they shall all fall within the scope of the claims of the present invention.

DETAILED DESCRIPTION OF THE INVENTION

In order to make the purpose, technical solutions, and advantages of the present invention clearer, the technical solutions of the present invention will be clearly and completely described below through implementation manners with reference to the accompanying drawings in the embodiments of the present invention. Obviously, the described embodiments are some, rather than all, embodiments of the present invention. Based on the basic concepts disclosed and prompted by the embodiments of the present invention, all other embodiments obtained by those skilled in the art fall within the protection scope of the present invention.

Figure 1:
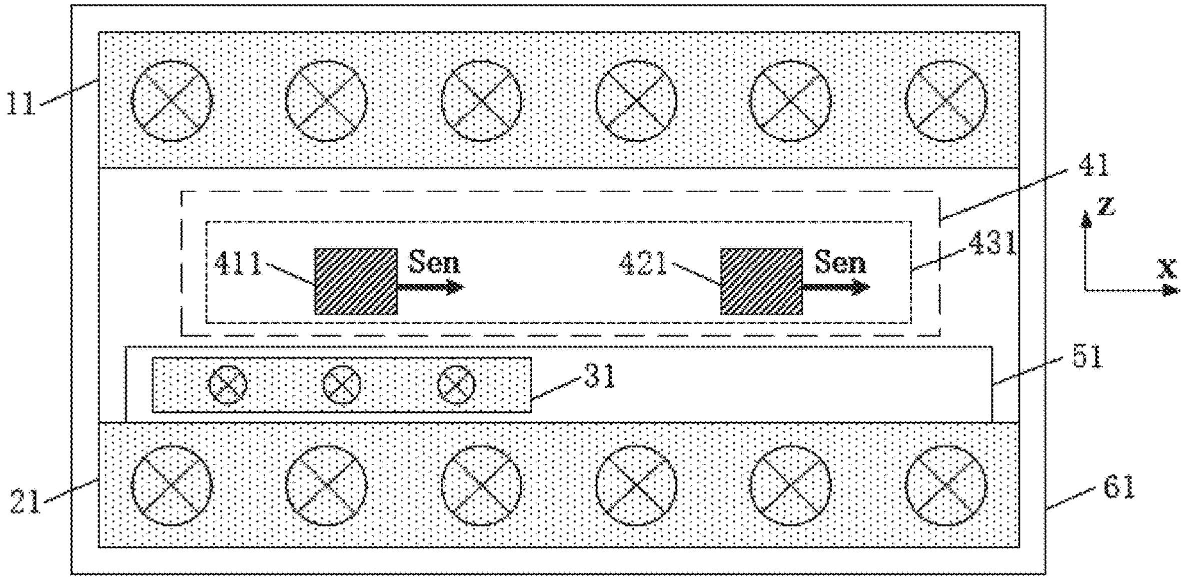
FIG. 1 is a schematic diagram of a current sensor according to an embodiment of the present invention.

Reference is made to FIG. 1, which is a schematic diagram of a current sensor according to an embodiment of the present invention. As shown in FIG. 1, the current sensor according to an embodiment of the present invention comprises: a to-be-measured current input component composed of a first current shunting copper bar 11, a second current shunting copper bar 21, and a differential copper bar 31 arranged between the first current shunting copper bar 11 and the second current shunting copper bar 21, and the first current shunting copper bar 11, the second current shunting copper bar 21, and the differential copper bar 31 are arranged in the same direction; and a signal output component that is electrically isolated from said to-be-measured current input component and comprises a magnetic induction module 41 and a substrate 51, and the magnetic induction module 41 is fixed on the substrate 51; wherein a current to be measured flows through a cross section perpendicular to the first current shunting copper bar 11, the second current shunting copper bar 21, and the differential copper bar 31, and generates a magnetic field at the position of the magnetic induction module 41; the magnetic induction module 41 at least comprises a first magnetic induction unit 411 and a second magnetic induction unit 421, the first magnetic induction unit 411 and the second magnetic induction unit 421 are located between the differential copper bar 31 and the first current shunting copper bar 11, and the first magnetic induction unit 411 and the second magnetic induction unit 421 sense, in a differential manner, a differential mode magnetic field generated by said to-be-measured current input component, and generate a differential voltage signal to form an output signal of the current sensor.

In the present embodiment, the first current shunting copper bar 11, the second current shunting copper bar 21, and the differential copper bar 31 constitute the to-be-measured current input component. The three copper bars jointly shunt the current to be measured, wherein the current direction of the current to be measured in the first current shunting copper bar 11, the current direction of the current to be measured in the second current shunting copper bar 21, and the current direction of the current to be measured in the differential copper bar 31 are the same. As shown in FIG. 1, the first current shunting copper bar 11, the second current shunting copper bar 21, and the differential copper bar 31 are arranged in parallel along the Z direction.

The magnetic induction module 41 and the substrate 51 constitute the signal output component, the signal output component is electrically isolated from said to-be-measured current input component, and the magnetic induction module 41 is fixed on the substrate 51. As shown in FIG. 1, the first current shunting copper bar 11 is disposed on a side of the magnetic induction module 41 away from the substrate 51, and the second current shunting copper bar 21 is disposed on a side of the substrate 51 away from the magnetic induction module 41. Along the direction shown in the figure, the first current shunting copper bar 11 is disposed above the magnetic induction module 41, the second current shunting copper bar 21 is disposed below the differential copper bar 31, and the magnetic induction module 41 is disposed above the differential copper bar 31. The current to be measured flows through a cross section perpendicular to the first current shunting copper bar 11, the second current shunting copper bar 21, and the differential copper bar 31, and generates a magnetic field at the position of the magnetic induction module 41. It can be understood that the cross section of the first current shunting copper bar 11, the second current shunting copper bar 21, and the differential copper bar 31 is the X-Z plane, and then the current direction of the current to be measured is perpendicular to the X-Z plane as shown in FIG. 1.

The magnetic induction module 41 at least comprises the first magnetic induction unit 411 and the second magnetic induction unit 421, the first magnetic induction unit 411 and the second magnetic induction unit 421 are located between the differential copper bar 31 and the first current shunting copper bar 11, and the first magnetic induction unit 411 and the second magnetic induction unit 421 are arranged along the X direction. The first magnetic induction unit 411 and the second magnetic induction unit 421 sense and measure, in a differential manner, a differential mode magnetic field generated by said to-be-measured current input component, and generate a differential voltage signal to form an output signal of the current sensor. Optionally, the sensitivity direction of each magnetic induction unit in the magnetic induction module 41 is parallel to the plane where the substrate 51 is located, as the sensitivity direction of the magnetic induction unit is the rightward direction as shown in FIG. 1, that is, the X direction.

Optionally, the first magnetic induction unit 411 and the second magnetic induction unit 421 are disposed on the same horizontal plane, and the horizontal plane is parallel to the plane where the substrate 51 is located; in a direction Z perpendicular to the plane where the substrate 51 is located, the vertical projection of the differential copper bar 31 on the plane where the substrate 51 is located covers the first magnetic induction unit 411 and does not overlap with the second magnetic induction unit 421; in the direction Z perpendicular to the plane where the substrate 51 is located, the vertical projection of the first current shunting copper bar 11 on the plane where the substrate 51 is located covers the first magnetic induction unit 411 and the second magnetic induction unit 421, and the vertical projection of the second current shunting copper bar 21 on the plane where the substrate 51 is located covers the first magnetic induction unit 411 and the second magnetic induction unit 421.

As described above, the first magnetic induction unit 411 and the second magnetic induction unit 421 are disposed on the same horizontal plane, the horizontal plane is parallel to the plane where the substrate 51 is located, and the plane where the substrate 51 is located is perpendicular to the X-Z plane. In the Z direction, vertical projection is performed on the first current shunting copper bar 11, the second current shunting copper bar 21, the differential copper bar 31, the first magnetic induction unit 411, and the second magnetic induction unit 421 on the plane where the substrate 51 is located, and then the relationship between the projections of the structures on the plane where the substrate 51 is located is that the projection of the first magnetic induction unit 411 is within the projection range of the differential copper bar 31, the projection of the second magnetic induction unit 421 is outside the projection range of the differential copper bar 31, the projection of the first current shunting copper bar 11 covers the projection of the first magnetic induction unit 411 and the projection of the second magnetic induction unit 421, and the projection of the second current shunting copper bar 21 covers the projection of the first magnetic induction unit 411 and the projection of the second magnetic induction unit 421. The magnetic field of each copper bar just needs to cover the range of the magnetic induction units, thereby achieving a chip-level size of a current sensor.

Optionally, the current sensor further comprises: a housing 61, wherein the to-be-measured current input component and the signal output component are both fixedly disposed inside the housing 61. Optionally, the differential copper bar 31 is disposed inside the substrate 51. In the present embodiment, the housing 61 is a mechanical support housing, and the mechanical support housing serves to wrap, fix, and support various parts in the current sensor and provide an external interface. The differential copper bar 31 embedded inside the substrate 51, and the position thereof in the substrate 51 is relatively closer to the first magnetic induction unit 411.

Optionally, the sensitivity direction of the first magnetic induction unit 411 and the sensitivity direction of the second magnetic induction unit 421 are the same as or opposite to the direction of the magnetic field generated by the current to be measured via the differential copper bar 31 at the position of the first magnetic induction unit 411. When the current to be measured flows through the differential copper bar 31, the differential copper bar 31 generates a magnetic field at the position of the first magnetic induction unit 411, and at this moment, the direction of the magnetic field is taken to be the same as the sensitivity direction of the first magnetic induction unit 411 and also the same as the sensitivity direction of the second magnetic induction unit 421. Specifically, referring to FIG. 1, the direction of the magnetic field generated by the differential copper bar 31 at the position of the first magnetic induction unit 411 is in the plane where the magnetic induction module 41 is located and perpendicular to the direction of the current to be measured. Here, the direction of the current to be measured is perpendicular to the X-Z plane, and then the direction of the magnetic field generated by the differential copper bar 31 at the position of the first magnetic induction unit 411 is parallel to the X direction.

On the basis of the above-described structure, the working principle of the current sensor will be described in detail through specific examples.

Figure 2:
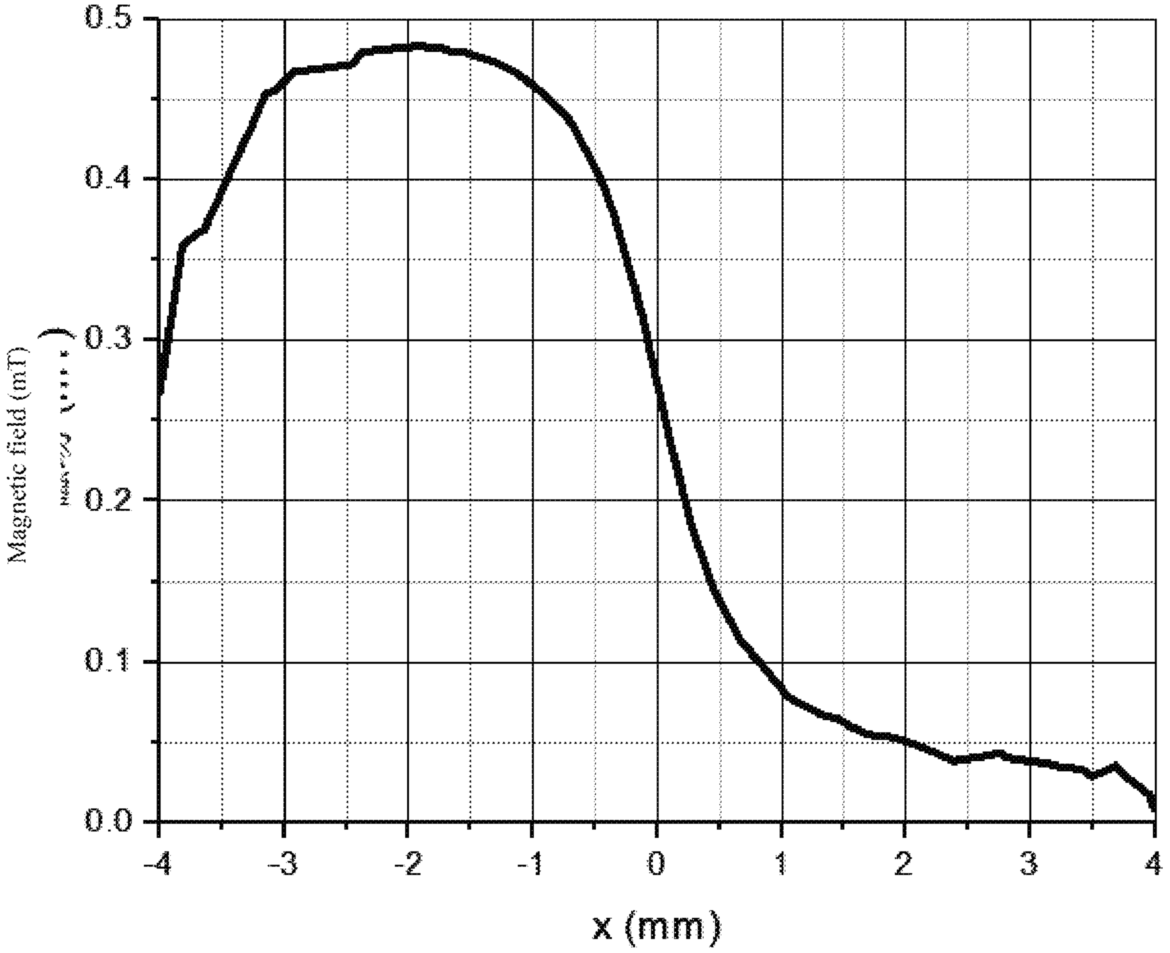
FIG. 2 is a schematic diagram of simulation of the current sensor in FIG. 1.

Reference is made to FIG. 2, which is a schematic diagram of simulation of the current sensor in FIG. 1. It is set that the current to be measured $I_{in}$ is 50 A, and the cross-sectional width of the to-be-measured current input component is 10 mm. In combination with FIG. 1, the cross-sectional width of the to-be-measured current input component is a size from the top surface of the first current shunting copper bar 11 to the bottom surface of the second current shunting copper bar 21 in the Z direction, and the magnetic induction module 41 is disposed at the position of the horizontal plane that is 0.6 mm above the differential copper bar 31. Then, when the current to be measured flows through the copper bar in a direction perpendicular to the cross-sectional X-Z plane of the to-be-measured current input component, a magnetic field is generated at the position of the horizontal plane that is 0.6 mm above the differential copper bar 31.

As can be seen, there is an obvious difference between magnetic fields close to the edges of the vertical projections above the differential copper bar 31, that is, the positions of the first magnetic induction unit 411 and the second magnetic induction unit 421, and the magnetic field generated near the ±3 mm positions in the X axis shown in FIG. 2 is relatively uniform, which can effectively generate a differential mode magnetic field.

It is set that the first magnetic induction unit 411 is disposed in the magnetic field uniform area within the coverage of the vertical projection above the differential copper bar 31, and the second magnetic induction unit 421 is disposed in the magnetic field uniform area outside the coverage of the vertical projection above the differential copper bar 31; these two magnetic induction units are simultaneously located in the magnetic field uniform area of the first current shunting copper bar 11, and the two magnetic induction units may also be simultaneously located in the magnetic field uniform area of the second current shunting copper bar 21; the first current shunting copper bar 11, the second current shunting copper bar 21, and the differential copper bar 31 are connected in parallel to shunt the current to be measured $I_{in}$. Then, in the case where the materials are uniform, the current density in the cross section in FIG. 1 may be deemed to be the same, that is, the current is directly proportional to the cross-sectional area.

Let the current flowing through the first current shunting copper bar 11 be $I_1$, the current flowing through the second current shunting copper bar 21 be $I_2$, and the current flowing through the differential copper bar 31 be $I_3$, then the following equation (I) exists:

$$I_m = I_1 + I_2 + I_3. \tag{1}$$

Since the first magnetic induction unit 411 and the second magnetic induction unit 421 are both located in the magnetic field uniform areas of the first current shunting copper bar 11 and the second current shunting copper bar 21, the current flowing through the first current shunting copper bar 11 generates a uniform magnetic field at the positions of the first magnetic induction unit 411 and the second magnetic induction unit 421, and the current flowing through the second current shunting copper bar 21 generates a uniform magnetic field at the positions of the first magnetic induction unit 411 and the second magnetic induction unit 421.

Let the linear constant of the magnetic field generated by the first current shunting copper bar 11 at the positions of the first magnetic induction unit 411 and the second magnetic induction unit 421 be $k_1$, the linear constant of the magnetic field generated by the second current shunting copper bar 21 at the positions of the first magnetic induction unit 411 and the second magnetic induction unit 421 be $k_2$, the linear constant of the magnetic field generated by the differential copper bar 31 at the position of the first magnetic induction unit 411 be $k_{31}$, and the linear constant of the magnetic field generated by the differential copper bar 31 at the position of the second magnetic induction unit 421 be $k_{32}$. With the right direction shown in the figure being the positive direction of the magnetic field and according to the Biot-Savart Law that a current-carrying wire generates a magnetic field, the magnetic field $H_{41}$ generated at the position of the first magnetic induction unit 411 and the magnetic field $H_{42}$ generated at the position of the second magnetic induction unit 421 by the to-be-measured current input component respectively change linearly along with the current. The following equation (2) is obtained:

$$\begin{aligned} H_{41} &= \sim k_1 I_1 + k_2 I_2 + k_{31} I_3; \\ H_{42} &= \sim k_1 I_1 + k_2 I_2 + k_{32} I_3 \end{aligned}. \tag{2}$$

Equivalent transformation is performed on the equation (2), and then the magnetic field at the position of the first magnetic induction unit 411 and the magnetic field at the position of the second magnetic induction unit 421 by the to-be-measured current input component may be decomposed into a common mode magnetic field $H_{CM}$ and a differential mode magnetic field $H_{DM}$, as indicated by the following equation (3):

$$\begin{aligned} H_{CM} &= \frac{1}{2}(H_{41} + H_{42}) = \sim k_1 I_1 + k_2 I_2 + \frac{1}{2}(k_{31} + k_{32}) \times I_3 \\ H_{DM} &= \frac{1}{2}(H_{41} \sim H_{42}) = \frac{1}{2}(k_{31} \sim k_{32}) \times I_3 \end{aligned}. \tag{3}$$

Correspondingly, the magnetic field of the to-be-measured current input component at the positions of the first magnetic induction unit 411 and the second magnetic induction unit 421 can be transformed to a superposition of the common mode magnetic field $H_{CM}$ and the differential mode magnetic field $H_{DM}$, which is represented by the following equation (4):

$$\begin{aligned} H_{11} &= H_{CM} + H_{DM}; \\ H_{12} &= H_{CM} - H_{DM} \end{aligned}. \tag{4}$$

The magnetic field generated by the differential copper bar 31 at the position of the second magnetic induction unit 421 is very small, which can thus be approximately considered as $k_{32}=0$, and then the equation (3) can be simplified as the following equation (5):

$$\begin{aligned} H_{CM} &= \frac{1}{2}(H_{41} + H_{42}) = \sim k_1 I_1 + k_2 I_2 + \frac{1}{2} k_{31} I_3 \\ H_{DM} &= \frac{1}{2}(H_{41} \sim H_{42}) = \frac{1}{2} k_{31} I_3 \end{aligned}. \tag{5}$$

As can be seen from the equation (5) and FIG. 1, the direction of the magnetic field generated by the first current shunting copper bar 11 at the positions of the first magnetic induction unit 411 and the second magnetic induction unit 421 is opposite to the direction of the magnetic field generated by the second current shunting copper bar 21 at the positions of the first magnetic induction unit 411 and the second magnetic induction unit 421, and then the two can be mutually offset and reduced. In addition, the common mode magnetic field $H_{CM}$ of the to-be-measured current input component at the positions of the first magnetic induction unit 411 and the second magnetic induction unit 421 is related to the first current shunting copper bar 11, the second current shunting copper bar 21, and the differential copper bar 31, while the differential mode magnetic field $H_{DM}$ of the to-be-measured current input component at the positions of the first magnetic induction unit 411 and the second magnetic induction unit 421 is only related to the differential copper bar 31; therefore, the first current shunting copper bar 11 and the second current shunting copper bar 21 only generate the common mode magnetic field $H_{CM}$ at the positions of the first magnetic induction unit 411 and the second magnetic induction unit 421 without generating the differential mode magnetic field $H_{DM}$. As such, it can regulate and increase the current input range of a current sensor.

Furthermore, in an ideal situation, the common mode magnetic field $H_{CM}$ generated by the to-be-measured current input component at the positions of the first magnetic induction unit 411 and the second magnetic induction unit 421 is completely offset to zero, and then the decomposition of the magnetic field generated by the to-be-measured current input component at the positions of the first magnetic induction unit 411 and the second magnetic induction unit 421 can only consider the differential mode magnetic field $H_{DM}$. In combination with FIG. 1, the magnetic field generated by the differential copper bar 31 at the position of the second magnetic induction unit 421 is very small, which can be approximately considered as $k_{32}=0$, and then the equation (3) can be simplified as the following equation (6):

$$H_{CM}=0\text{: } H_{DM}=k_{31}I_3/2. \tag{6}$$

Then, the equation (4) can be simplified as the following equation (7):

$$H_{41}=H_{DM}=k_{31}I_3/2;\ H_{42}=\sim H_{DM}=\sim k_{31}I_3/2. \tag{7}$$

In summary, the first current shunting copper bar 11, the second current shunting copper bar 21, and the differential copper bar 31 jointly shunt the current to be measured $I_{in}$, the magnetic field of which at the positions of the first magnetic induction unit 411 and the second magnetic induction unit 421 is directly proportional to the current to be measured $I_{in}$, which can achieve the detection of the current to be measured by measuring the differential mode magnetic field $H_{DM}$.

As can be seen by combining the equations (6) and (7), in an ideal situation, the common mode magnetic field Hem generated by the to-be-measured current input component at the positions of the first magnetic induction unit 411 and the second magnetic induction unit 421 can be completely offset, and therefore, the operating range of the magnetoresistive sensitive elements can be fully covered by the differential mode magnetic field $H_{DM}$, which provides the maximal measurement current range for the current sensor.

In the embodiment of the present invention, the first current shunting copper bar, the second current shunting copper bar, and the differential copper bar constitute the to-be-measured current input component, and generate a magnetic field at the position of the magnetic induction module; two magnetic induction units in the magnetic induction module sense, in a differential manner, a differential mode magnetic field generated when a current to be measured flows through said to-be-measured current input component, and thus generate a differential voltage signal, the differential voltage signal output by the magnetic induction module forming an output signal of the current sensor The current sensor provided by the embodiments of the present invention is a novel current sensor, which can control common mode magnetic field working points, and can solve the problem that magnetoresistive sensitive elements are prone to saturation, thereby addressing the limitations by high accuracy to the measurement current range in existing current sensors. Moreover, the structure of the current sensor provided by the embodiments of the present invention is applicable to small-volume current sensor chips, which realizes the high accuracy and adjustable current measurement range of current sensors, can be applied to various different working ranges, and achieves advantages of simple structure, strong resistance to external magnetic field interference, capability of measuring large DC and AC currents, input and output electrical isolation, good linearity, high accuracy, good stability, small volume, and wide range.

Optionally, the first magnetic induction unit at least comprises one magnetoresistive bridge arm, and the second magnetic induction unit at least comprises one magnetoresistive bridge arm; the magnetoresistive bridge arm of the first magnetic induction unit and the magnetoresistive bridge arm of the second magnetic induction unit are electrically connected to form a differential half-bridge structure or a differential full-bridge structure, wherein all magnetoresistive bridge arms have the same sensitivity direction, and the magnetoresistive bridge arm is formed by connecting at least one magnetoresistive sensitive element in series and parallel. Optionally, the magnetic induction unit is composed of any one magnetoresistive sensitive element from anisotropic magnetoresistor AMR, giant magnetoresistor GMR, tunnel magnetoresistor TMR, and colossal magnetoresistor CMR.

Figure 3:
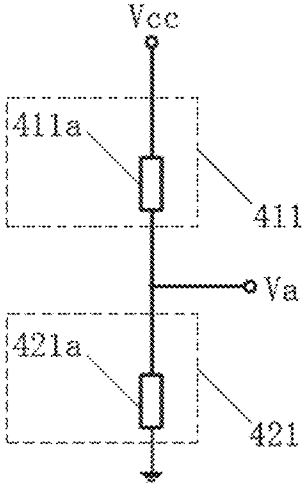
FIG. 3 is a schematic diagram of a differential half-bridge structure of the current sensor in FIG. 1.

Reference is made to FIG. 3, which is a schematic diagram of a differential half-bridge structure of the current sensor in FIG. 1. As shown in FIG. 3, the first magnetic induction unit 411 comprises one magnetoresistive bridge arm 411*a*, and the second magnetic induction unit 421 comprises one magnetoresistive bridge arm 421*a*. Each magnetoresistive bridge arm is formed by connecting one or more magnetoresistive sensitive elements in series and parallel, and the two magnetoresistive bridge arms 411*a* and 421*a* have the same sensitivity direction, for example, the sensitivity direction is the horizontal rightward X direction shown in FIG. 1, and form a differential half-bridge structure electrically. Optionally, the magnetoresistive sensitive elements that constitute the magnetic induction units in FIG. 3 are tunnel magnetoresistors TMR.

As can be seen by combining the above analysis and FIG. 1 and FIG. 3, the first current shunting copper bar 11 and the second current shunting copper bar 21 can only offset and reduce the common mode magnetic field Hem without generating the differential mode magnetic field $H_{DM}$, and the offset common mode magnetic field Hem may be of the same direction, zeroed, or of the opposite direction.

Assuming that the offset common mode magnetic field $H_{CM}$ is of the same direction, the differential mode magnetic field $H_{DM}$ causes the rightward magnetic field at the position of the first magnetic induction unit 411 to be greater than the rightward magnetic field at the position of the second magnetic induction unit 421, and since the two magnetoresistive bridge arms 411*a* and 421*a* both have the rightward sensitivity direction, the rightward magnetic field at the position of the magnetoresistive bridge arm 411*a* is greater than the rightward magnetic field at the position of the magnetoresistive bridge arm 421*a*. Therefore, by setting the resistance of the magnetoresistive bridge arm 411*a* to be smaller than the resistance of the magnetoresistive bridge arm 421*a*, the transformation from the magnetic field to voltage can be realized. Therefore, Va in FIG. 3 will change correspondingly according to the situation of the current to be measured to form a differential voltage signal.

Referring to FIG. 1, optionally, the current sensor further comprises an open-loop signal conditioning circuit 431, wherein the open-loop signal conditioning circuit 431 performs conditioning and amplification, temperature compensation, and linearity correction on differential voltage signals. In the present embodiment, the magnetic induction module 41 further comprises the open-loop signal conditioning circuit 431, wherein the open-loop signal conditioning circuit 431 performs conditioning and amplification, temperature compensation, and linearity correction on differential voltage signals generated by the first magnetic induction unit 411 and the second magnetic induction unit 421, so as to form an output signal of the magnetic induction module 41. Thus, the output of the magnetic induction module 41 forms an output signal of the current sensor.

As described above, the differential copper bar 31 forms a differential mode magnetic field, and the common mode magnetic field formed by the first current shunting copper bar 11 and the second current shunting copper bar 21 mutually offsets and reduces the common mode magnetic field formed by the differential copper bar 31, which expands the measurement current range of the current sensor.

In the present embodiment, an open-loop signal conditioning circuit is adopted to make a novel differential current sensor with an adjustable current measurement range and capable of effectively increasing the measurement range of a current to be measured, which effectively solves the problem that magnetoresistive sensitive elements are prone to saturation, provides strong resistance to external magnetic field interference, and has characteristics including capability of measuring large DC and AC currents, simple construction, and input and output electrical isolation. Here, the copper bar magnetic field only needs to cover the range of magnetic induction units, and therefore, the current sensor can achieve a chip-level volume; in combination with the characteristics of the tunnel magnetoresistance device including small volume, high signal amplitude, high sensitivity, low noise, and easiness to be integrated with a semiconductor circuit, it can further simplify the design of a current sensor backend signal processing circuit, reduce the volume of the entire current sensor, and lower the cost of the current sensor.

Optionally, the first magnetic induction unit comprises one first half bridge or first full bridge, and the second magnetic induction unit comprises one second half bridge or second full bridge; an output voltage difference between the bridge of the first magnetic induction unit and the bridge of the second magnetic induction unit generates a differential voltage signal.

Optionally, the first half bridge comprises two magnetoresistive bridge arms with opposite sensitivity directions, and the second half bridge comprises two magnetoresistive bridge arms with opposite sensitivity directions; alternatively, the first full bridge comprises four magnetoresistive bridge arms with two adjacent magnetoresistive bridge arms that are electrically connected having opposite sensitivity directions, and the second full bridge comprises four magnetoresistive bridge arms with two adjacent magnetoresistive bridge arms that are electrically connected having opposite sensitivity directions; here, the magnetoresistive bridge arm is formed by one magnetoresistive sensitive element or by connecting more than one magnetoresistive sensitive element in series and parallel.

Figure 4:
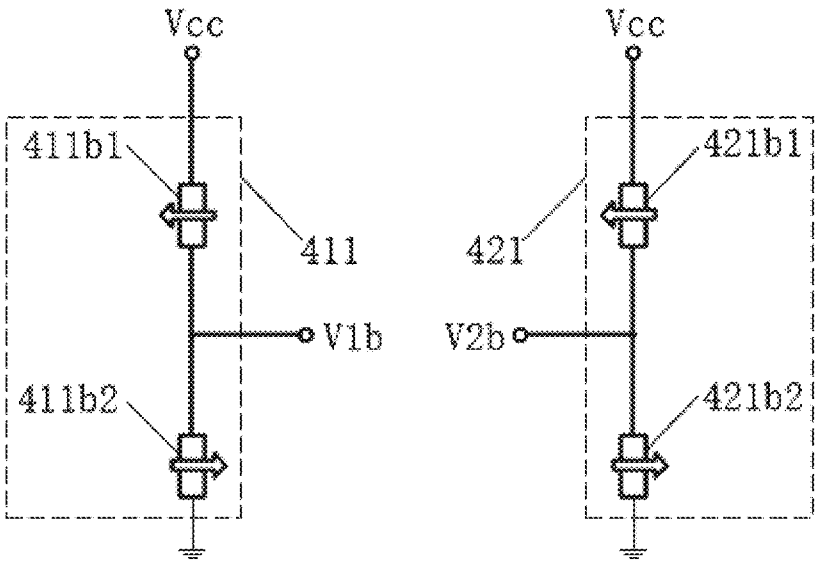
FIG. 4 is a schematic diagram of another bridge structure of the current sensor in FIG. 1.

Reference is made to FIG. 4, which is a schematic diagram of another bridge structure of the current sensor in FIG. 1. As shown in FIG. 4, the first magnetic induction unit 411 comprises one first half bridge, and the second magnetic induction unit 421 comprises one second half bridge. The first half bridge comprises two magnetoresistive bridge arms **411*b*1 and 411*b*2, and the second half bridge comprises two magnetoresistive bridge arms 421*b*1 and 421*b*2**.

The sensitivity directions of the magnetoresistive bridge arms in each bridge are different. In the first half bridge, the sensitivity directions of the magnetoresistive bridge arms **411*b*1 and 411*b*2 are opposite, and specifically, the sensitivity direction of the magnetoresistive bridge arm 411*b*1 is leftward as shown in the figure, and the sensitivity direction of the magnetoresistive bridge arm 411*b*2 is rightward as shown in the figure; in the second half bridge, the sensitivity directions of the magnetoresistive bridge arms 421*b*1 and 421*b*2 are opposite, and specifically, the sensitivity direction of the magnetoresistive bridge arm 421*b*1 is leftward as shown in the figure, and the sensitivity direction of the magnetoresistive bridge arm 421*b*2** is rightward as shown in the figure.

As can be seen by combining the above analysis and FIG. 1 and FIG. 4, the first current shunting copper bar 11 and the second current shunting copper bar 21 can only offset and reduce the common mode magnetic field Hem without generating the differential mode magnetic field $H_{DM}$, and the offset common mode magnetic field $H_{CM}$ may be of the same direction, zeroed, or of the opposite direction.

Assuming that the offset common mode magnetic field is rightward and that the rightward magnetic field at the position of the first magnetic induction unit 411 is greater than the rightward magnetic field at the position of the second magnetic induction unit 421 after the differential mode magnetic field is superposed, then the resistance of the magnetoresistive bridge arm **411*b*1 is greater than the resistance of the magnetoresistive bridge arm 411*b*2, the resistance of the magnetoresistive bridge arm 421*b*1 is greater than the resistance of the magnetoresistive bridge arm 421*b*2, and the resistance difference of the magnetoresistive bridge arms 411*b*1 and 411*b*2 is greater than the resistance difference of the magnetoresistive bridge arms 421*b*1 and 421*b*2, thereby realizing the transformation from the magnetic field to voltage. Therefore, in FIG. 4**, the output voltage V1*b* of the bridge of the first magnetic induction unit 411 and the output voltage V2*b* of the bridge of the second magnetic induction unit 421 will change correspondingly according to the situation of the current to be measured, and the difference between the output voltages of the two forms a differential voltage signal.

Figure 5:
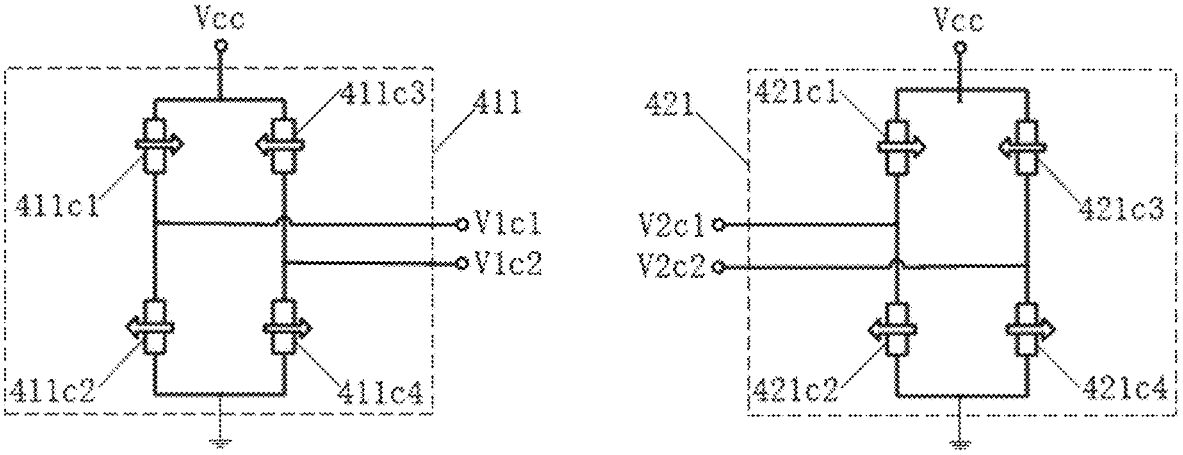
FIG. 5 is a schematic diagram of yet another bridge structure of the current sensor in FIG. 1.

Reference is made to FIG. 5, which is a schematic diagram of yet another bridge structure of the current sensor in FIG. 1. As shown in FIG. 5, the first magnetic induction unit 411 comprises one first full bridge, and the second magnetic induction unit 421 comprises one second full bridge. The first full bridge comprises four magnetoresistive bridge arms **411*c*1, 411*c*2, 411*c*3, and 411*c*4, and the second full bridge comprises four magnetoresistive bridge arms 421*c*1, 421*c*2, 421*c*3, and 421*c*4**. The sensitivity directions of the magnetoresistive bridge arms in each bridge may not be completely the same.

In the first full bridge, each of the magnetoresistive bridge arms **411*c*1, 411*c*2, 411*c*3, and 411*c*4 in the full-bridge connection structure has a sensitivity direction that is opposite to that of its electrically adjacent magnetoresistive bridge arms. That is, the magnetoresistive bridge arm 411*c*1 has a sensitivity direction that is opposite to that of its adjacent magnetoresistive bridge arms 411*c*2 and 411*c*3, and the magnetoresistive bridge arm 411*c*4 has a sensitivity direction that is opposite to that of its adjacent magnetoresistive bridge arms 411*c*2 and 411*c*3. As a result, the sensitivity directions of the magnetoresistive bridge arms 411*c*1 and 411*c*4 are the same and rightward as shown in the figure, the sensitivity directions of the magnetoresistive bridge arms 411*c*2 and 411*c*3 are the same and leftward as shown in the figure, and the sensitivity directions of the magnetoresistive bridge arms 411$c$1 and 411$c$2** are opposite.

In the second full bridge, each of the magnetoresistive bridge arms 421$c$1, 421$c$2, 421$c$3, and 421$c$4 in the full-bridge connection structure has a sensitivity direction that is opposite to that of its electrically adjacent magnetoresistive bridge arms. That is, the magnetoresistive bridge arm 421$c$1 has a sensitivity direction that is opposite to that of its adjacent magnetoresistive bridge arms 421$c$2 and 421$c$3, and the magnetoresistive bridge arm 421$c$4 has a sensitivity direction that is opposite to that of its adjacent magnetoresistive bridge arms 421$c$2 and 421$c$3. As a result, the sensitivity directions of the magnetoresistive bridge arms 421$c$1 and 421$c$4 are the same and rightward as shown in the figure, the sensitivity directions of the magnetoresistive bridge arms 421$c$2 and 421$c$3 are the same and leftward as shown in the figure, and the sensitivity directions of the magnetoresistive bridge arms 421$c$1 and 421$c$2 are opposite.

As can be seen by combining the above analysis and FIG. 1 and FIG. 5, the first current shunting copper bar 11 and the second current shunting copper bar 21 can only offset and reduce the common mode magnetic field $H_{CM}$ without generating the differential mode magnetic field $H_{DM}$, and the offset common mode magnetic field $H_{CM}$ may be of the same direction, zeroed, or of the opposite direction.

Assuming that the offset common mode magnetic field is rightward and that the rightward magnetic field at the position of the first magnetic induction unit 411 is greater than the rightward magnetic field at the position of the second magnetic induction unit 421 after the differential mode magnetic field is superposed, then the resistance of the magnetoresistive bridge arms 411$c$2 and 411$c$3 is greater than the resistance of the magnetoresistive bridge arms 411$c$1 and 411$c$4, the resistance of the magnetoresistive bridge arms 421$c$2 and 421$c$3 is greater than the resistance of the magnetoresistive bridge arms 421$c$2 and 421$c$3, the difference between the resistance of the magnetoresistive bridge arms 411$c$2 and 411$c$3 and the resistance of the magnetoresistive bridge arms 411$c$1 and 411$c$4 is the difference 1, the difference between the resistance of the magnetoresistive bridge arms 421$c$2 and 421$c$3 and the resistance of the magnetoresistive bridge arms 421$c$1 and 421$c$4 is the difference 2, and the difference 1 is greater than the difference 2. As a result, the transformation from the magnetic field to voltage is realized. Here, in FIG. 5, the voltage difference between V1$c$1 and V1$c$2 forms an output voltage of the bridge of the first magnetic induction unit 411, and the voltage difference between V2$c$1 and V2$c$2 forms an output voltage of the bridge of the second magnetic induction unit 421. The output voltage of the first magnetic induction unit 411 and the output voltage of the second magnetic induction unit 421 will change correspondingly according to the situation of the current to be measured, and the difference between the output voltages of the two forms a differential voltage signal.

The above-described magnetoresistive bridge arms are composed of one magnetoresistive sensitive element; alternatively, the above-described magnetoresistive bridge arms are composed of multiple magnetoresistive sensitive elements connected in series and parallel.

For example, on the basis of any of the above embodiments, according to the characteristics of a closed-loop magnetic field current sensor including high linearity, good temperature features, high stability and reliability, and high-precision current measurement, a closed-loop magnetic field feedback coil is integrated into the current sensor to realize high-precision measurement of a current. A specific example is provided below.

Optionally, the first magnetic induction unit at least comprises one magnetoresistive bridge arm, and the second magnetic induction unit at least comprises one magnetoresistive bridge arm, the magnetoresistive bridge arm of the first magnetic induction unit and the magnetoresistive bridge arm of the second magnetic induction unit are electrically connected to form a differential half-bridge structure or a differential full-bridge structure, wherein all magnetoresistive bridge arms have the same sensitivity direction, and the magnetoresistive bridge arm is formed by connecting at least one magnetoresistive sensitive element in series and parallel. Optionally, the magnetic induction unit is composed of any one magnetoresistive sensitive element from anisotropic magnetoresistor AMR, giant magnetoresistor GMR, tunnel magnetoresistor TMR, and colossal magnetoresistor CMR.

Optionally, the current sensor further comprises a closed-loop signal conditioning circuit and a magnetic field feedback coil, wherein the closed-loop signal conditioning circuit, the magnetic field feedback coil, the first magnetic induction unit, and the second magnetic induction unit constitute a closed-loop magnetic field feedback structure; after being amplified by the closed-loop signal conditioning circuit, a differential voltage signal passes through the magnetic field feedback coil to generate a feedback magnetic field to reversely offset the differential mode magnetic field, the first magnetic induction unit and the second magnetic induction unit operate on equal common mode magnetic field working points when the magnetic field dynamic balance is achieved, and then the feedback current of the magnetic field feedback coil is sampled to form an output signal of the magnetic induction module.

Figure 6:
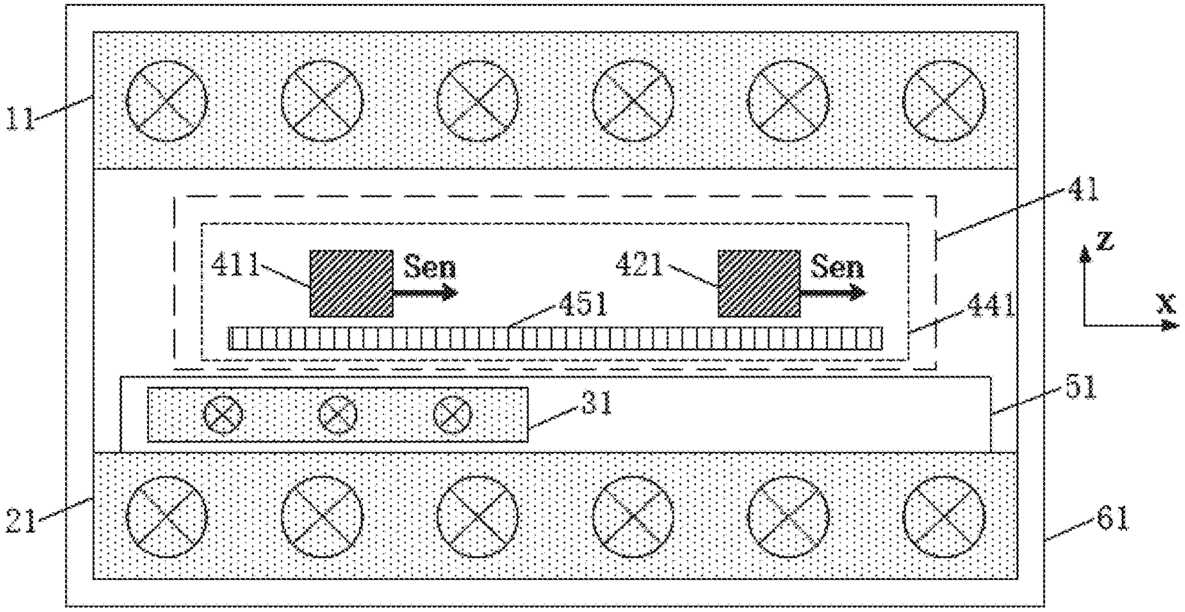
FIG. 6 is a schematic diagram of another current sensor according to an embodiment of the present invention.
Figure 7:
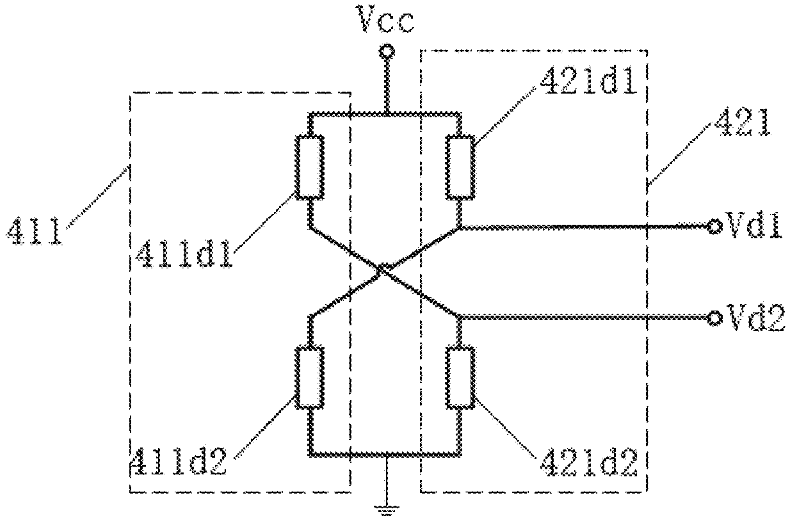
FIG. 7 is a schematic diagram of a differential full-bridge structure of the current sensor in FIG. 6.

Reference is made to FIG. 6, which is a schematic diagram of another current sensor according to an embodiment of the present invention. Reference is made to FIG. 7, which is a schematic diagram of a differential full-bridge structure of the current sensor in FIG. 6. As shown in FIG. 6, the current sensor further comprises a closed-loop signal conditioning circuit 441 and a magnetic field feedback coil 451. As shown in FIG. 7, the first magnetic induction unit 411 comprises two magnetoresistive bridge arms 411$d$1 and 411$d$2, and the second full bridge 421 comprises two magnetoresistive bridge arms 421$d$1 and 421$d$2; each magnetoresistive bridge arm is composed of one or more than one magnetoresistive sensitive element connected in series and parallel, the sensitivity directions of the four magnetoresistive bridge arms 411$d$1, 411$d$2, 421$d$1, and 421$d$2 are the same, for example, the sensitivity direction is the horizontal rightward direction as shown in FIG. 6, and they electrically form a differential full-bridge structure. Optionally, the magnetoresistive sensitive elements that constitute the magnetic induction units in FIG. 7 are tunnel magnetoresistors TMR.

Referring to FIG. 6, the first current shunting copper bar 11, the second current shunting copper bar 21, and the differential copper bar 31 are connected in parallel to shunt the current to be measured, the differential copper bar 31 forms a differential mode magnetic field, and the common mode magnetic field formed by the first current shunting copper bar 11 and the second current shunting copper bar 21 and the common mode magnetic field formed by the differential copper bar 31 offset and reduce each other. The difference relative to the differential current sensor shown in FIG. 1 lies in that the current sensor shown in FIG. 6 adopts structures such as the differential full-bridge circuit, the closed-loop signal conditioning circuit 441, and the magnetic field feedback coil 451 shown in FIG. 7 to form a closed-loop magnetic field negative feedback, with which a closed-loop magnetic field current sensor is formed. The closed-loop magnetic field current sensor has characteristics such as high linearity, good temperature features, high stability and reliability, and high-precision current measurement.

As can be seen by combining the above analysis and FIG. 6 and FIG. 7, the offset common mode magnetic field $H_{CM}$ of the to-be-measured current input component at the positions of the first magnetic induction unit 411 and the second magnetic induction unit 421 is of the same direction, and the differential mode magnetic field $H_{DM}$ causes the rightward magnetic field at the position of the first magnetic induction unit 411 to be greater than the rightward magnetic field at the position of the second magnetic induction unit 421. Since the sensitivity directions of the four magnetoresistive bridge arms 411*d*1, 411*d*2, 421*d*1, and 421*d*2 are all rightward, the rightward magnetic field at the positions of the magnetoresistive bridge arms 411*d*1 and 411*d*2 is greater than the rightward magnetic field at the positions of the magnetoresistive bridge arms 421*d*1 and 421*d*2, and therefore, the resistance of the magnetoresistive bridge arms 411*d*1 and 411*d*2 is smaller than the resistance of the magnetoresistive bridge arms 421*d*1 and 421*d*2. As a result, in FIG. 7, the Vd2 voltage is greater than the Vd1 voltage to form a differential voltage signal.

As described above, the closed-loop signal conditioning circuit 441, the magnetic field feedback coil 451, the first magnetic induction unit 411, and the second magnetic induction unit 421 constitute closed-loop magnetic field feedback. The closed-loop signal conditioning circuit 441 performs conditioning and amplification, temperature compensation, and linearity correction on the differential voltage signal of the first magnetic induction unit 411 and the second magnetic induction unit 421; the amplified differential voltage signal passes through the magnetic field feedback coil 451 to generate a feedback magnetic field that reversely offsets the differential mode magnetic field; when the magnetic field dynamic balance is achieved, the first magnetic induction unit 411 and the second magnetic induction unit 421 operate on equal common mode magnetic field working points, and then the feedback current of the magnetic field feedback coil 451 is sampled via a sampling resistor to form an output signal of the magnetic induction module 41.

Optionally, the magnetic field feedback coil 451 is integrated and disposed inside the magnetic induction module 41; alternatively, the magnetic field feedback coil 451 is integrated and disposed inside the substrate 51.

As shown in FIG. 6, the magnetic field feedback coil 451, the first magnetic induction unit 411, and the second magnetic induction unit 421 are all disposed inside the magnetic induction module 41. The magnetic field feedback coil 451 is not integrated with the magnetic induction units, and the two are disposed to be separated relative to each other.

Figure 8:
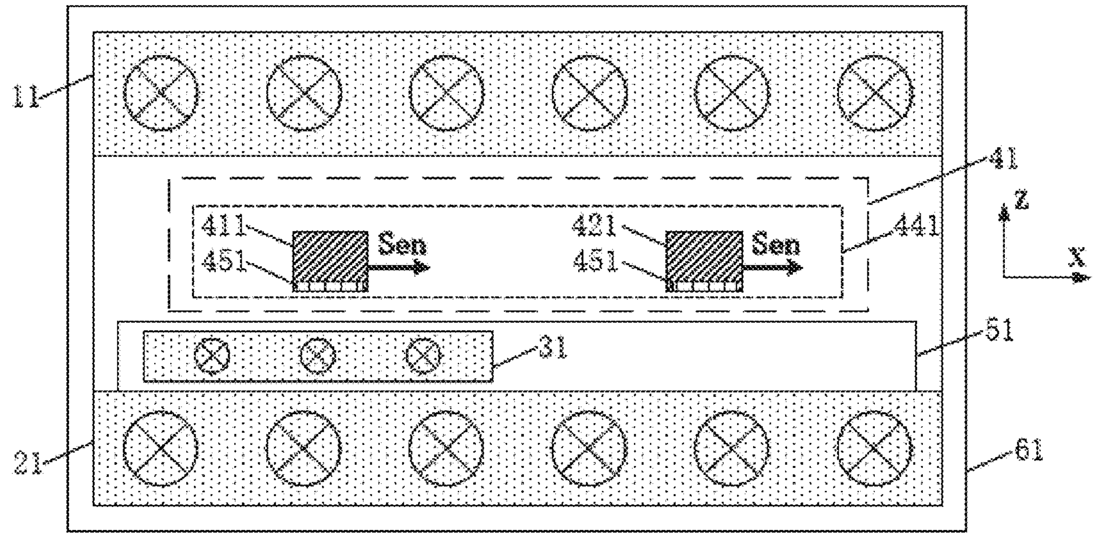
FIG. 8 is a schematic diagram of yet another current sensor according to an embodiment of the present invention.

Reference is made to FIG. 8, which is a schematic diagram of yet another current sensor according to an embodiment of the present invention. As shown in FIG. 8, the magnetic field feedback coil 451 is integrated and disposed inside the magnetic induction module 41, and specifically, the magnetic field feedback coil 451 is integrated and disposed inside the first magnetic induction unit 411, and the magnetic field feedback coil 451 is also integrated and disposed inside the second magnetic induction unit 421.

Figure 9:
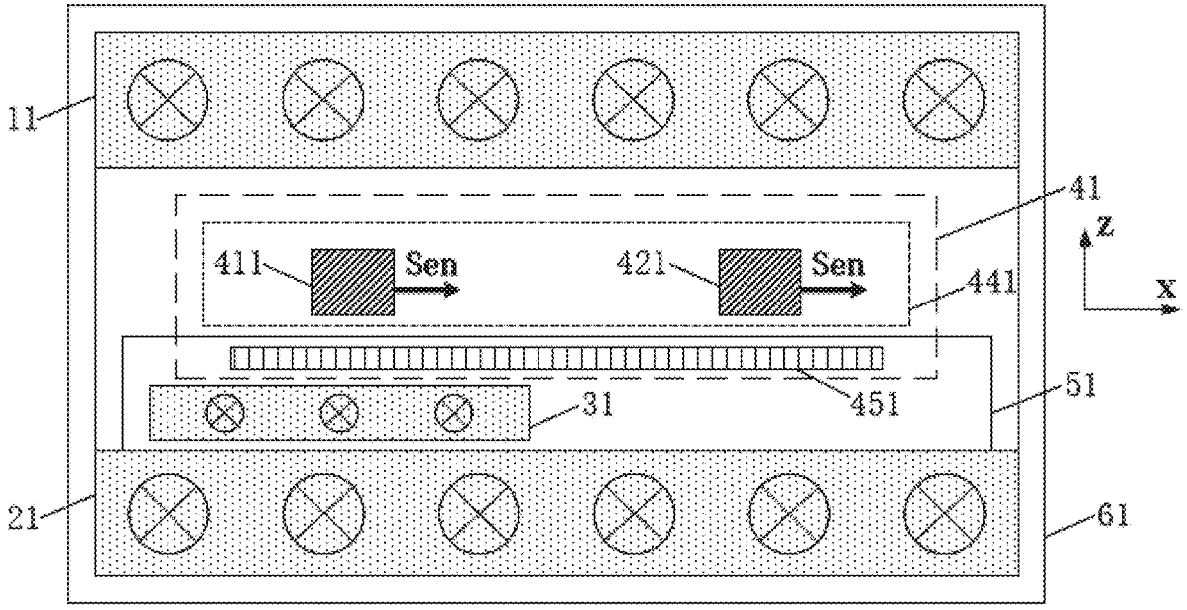
FIG. 9 is a schematic diagram of yet another current sensor according to an embodiment of the present invention.

Reference is made to FIG. 9, which is a schematic diagram of yet another current sensor according to an embodiment of the present invention. As shown in FIG. 9, the magnetic field feedback coil 451 is integrated and disposed inside the substrate 51.

It should be noted that the plane where the magnetic field feedback coil 451 is located is parallel to the plane where the substrate 51 is located, that is, the plane where the magnetic field feedback coil 451 is located is parallel to the plane where the first magnetic induction unit 411 and the second magnetic induction unit 421 are located. The magnetic field feedback coil 451 is cross-sectioned along the X-Z plane with the cross-sectional center line being parallel to the Z direction, and then the two sides of the cross-sectional center line are symmetrically distributed, the current direction at one side of the cross-sectional center line is perpendicular to the X-Z plane and opposite to the direction of the current to be measured in the copper bar, and the current direction at the other side of the cross-sectional center line is perpendicular to the X-Z plane and the same as the direction of the current to be measured in the copper bar. Taking FIG. 6 as an example, optionally, the current direction at the left side of the cross-sectional center line is perpendicular to the paper and outward, the current direction at the right side of the cross-sectional center line is perpendicular to the paper and inward, and the direction of the current to be measured in the copper bar is perpendicular to the paper and inward.

With regard to the direction of the feedback magnetic field generated by the magnetic field feedback coil 451, the above-described situation in which the rightward magnetic field at the position of the first magnetic induction unit 411 is greater than the rightward magnetic field at the position of the second magnetic induction unit 421 is taken as an example. In order to reversely offset the differential mode magnetic field. In the cross-sectional view of the current sensor shown in FIG. 6, the cross-sectional current direction of the conductors of the magnetic field feedback coil 451 horizontally arranged under the first magnetic induction unit 411 is perpendicular to the paper and outward, and the cross-sectional current direction of the conductors of the magnetic field feedback coil 451 horizontally arranged under the second magnetic induction unit 421 is perpendicular to the paper and inward. Therefore, the magnetic field feedback coil 451 generates a leftward feedback magnetic field at the position of the first magnetic induction unit 411, and the magnetic field feedback coil 451 generates a rightward feedback magnetic field at the position of the second magnetic induction unit 421, thereby reversely offsetting the differential mode magnetic field and achieving the magnetic field dynamic balance.

According to the current sensor provided by the embodiments of the present invention, the first current shunting copper bar and the second current shunting copper bar perform current shunting on the differential copper bar, and the magnetic fields generated by the first current shunting copper bar and the second current shunting copper bar at the position of the magnetic induction module have opposite directions, which can be partially or fully offset, such that the current measurement range is adjustable, and the range of the current to be measured can be effectively increased. It solves the problem that magnetoresistive sensitive elements are prone to saturation, and further addresses the limitations by high accuracy to the measurement current range in existing current sensors, leading to advantages of strong resistance to external magnetic field interference, low noise, good linearity, high accuracy, and good stability.

The embodiments of the present invention further provide a current sensor, which is different from the current sensors set forth in any of the above embodiments. Specifically, the current sensor provided by the present embodiment and the following embodiments do not comprise a differential copper bar.

Figure 10:
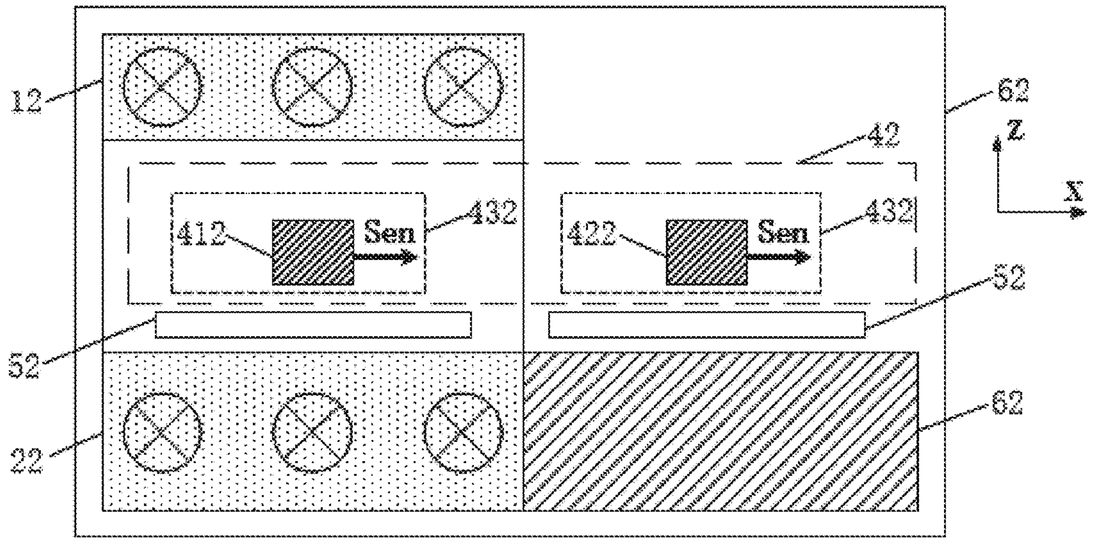
FIG. 10 is a schematic diagram of yet another current sensor according to an embodiment of the present invention.

Reference is made to FIG. 10, which is a schematic diagram of yet another current sensor according to an embodiment of the present invention. As shown in FIG. 10, the current sensor provided by the present embodiment comprises a to-be-measured current input component, composed of a first current shunting copper bar 12 and a second current shunting copper bar 22 that are connected in parallel; and a signal output component that is electrically isolated from said to-be-measured current input component and comprises a magnetic induction module 42 and a substrate 52, the magnetic induction module 42 being fixed on the substrate 52; wherein a current to be measured flows through a cross section perpendicular to the first current shunting copper bar 12 and the second current shunting copper bar 22, and generates a magnetic field at the position of the magnetic induction module 42; the magnetic induction module 42 at least comprises a first magnetic induction unit 412 and a second magnetic induction unit 422, the first magnetic induction unit 412 is located between the first current shunting copper bar 12 and the second current shunting copper bar 22, the first magnetic induction unit 412 and the second magnetic induction unit 422 are located on the same horizontal plane, the horizontal plane is parallel to the plane where the substrate 52 is located, and in a direction Z perpendicular to the plane where the substrate 52 is located, the vertical projection overlapping area of the first current shunting copper bar 12 and the second current shunting copper bar 22 on the plane where the substrate 52 is located does not overlap with the second magnetic induction unit 422; and the first magnetic induction unit 412 and the second magnetic induction unit 422 sense, in a differential manner, a magnetic field generated by said to-be-measured current input component, and generate a differential voltage signal to form an output signal of the current sensor.

In the present embodiment, the cross sections of the first current shunting copper bar 12 and the second current shunting copper bar 22 are the X-Z plane, and the current to be measured flows through the copper bars in a direction perpendicular to the X-Z plane and generates a magnetic field. That is, the current direction of the current to be measured is perpendicular to the X-Z plane, and all the specific current directions are perpendicular to the paper and inward.

The magnetic induction module 42 at least comprises a first magnetic induction unit 412 and a second magnetic induction unit 422 therein. The first magnetic induction unit 412 and the second magnetic induction unit 422 are located on the same horizontal plane, the horizontal plane is parallel to the plane where the substrate 52 is located, and specifically, the first magnetic induction unit 412 and the second magnetic induction unit 422 are located above the substrate 52.

The first magnetic induction unit 412 is disposed between the first current shunting copper bar 12 and the second current shunting copper bar 22, that is, in the Z direction, the vertical projection overlapping range of the first current shunting copper bar 12 and the second current shunting copper bar 22 covers the first magnetic induction unit 412, while in the Z direction, the vertical projection overlapping range of the first current shunting copper bar 12 and the second current shunting copper bar 22 does not overlap with the second magnetic induction unit 422, that is, the second magnetic induction unit 422 is located outside the vertical projection overlapping range of the first current shunting copper bar 12 and the second current shunting copper bar 22.

The first magnetic induction unit 412 and the second magnetic induction unit 422 sense, in a differential manner, a magnetic field generated when a current to be measured flows through said to-be-measured current input component, and generate a differential voltage signal, and at this point, the differential voltage signal output by the magnetic induction module 42 forms an output signal of the current sensor.

Optionally, the current sensor further comprises: a housing 62, wherein the to-be-measured current input component and the signal output component are both fixedly disposed inside the housing 62, and wherein the housing 62 is a mechanical support housing. It should be noted that the housing 62 further supports the second magnetic induction unit 422, and the magnetic induction module 42 adopts an open-loop signal conditioning circuit 432.

Optionally, the sensitivity direction of the first magnetic induction unit 412 and the sensitivity direction of the second magnetic induction unit 422 are the same. As shown in FIG. 10, the sensitivity direction of the magnetic induction units is the rightward X direction. The first current shunting copper bar 12 generates a leftward magnetic field at the position of the first magnetic induction unit 412, the second current shunting copper bar 22 generates a rightward magnetic field at the position of the first magnetic induction unit 412, and the two can offset and reduce each other. The magnetic field generated by the to-be-measured current input component at the position of the second magnetic induction unit 422 is determined by the relative position between the second magnetic induction unit 422 and the to-be-measured current input component, and with the structure of the current sensor shown in FIG. 10, the magnetic field generated by the to-be-measured current input component at the position of the second magnetic induction unit 422 may be approximated to be a zero magnetic field.

In the present embodiment, the first current shunting copper bar 12 and the second current shunting copper bar 22 shunt the current to be measured and generate opposite magnetic fields at the first magnetic induction unit 412, and the two can offset and reduce each other; by adjusting the position and structure of the to-be-measured current input component, the first current shunting copper bar 12 and the second current shunting copper bar 22 can be made to generate a zero magnetic field at the second magnetic induction unit 422. Therefore, the effect of adjusting the current measurement range is achieved, which effectively solves the problem that magnetoresistive sensitive elements in large current measurement are prone to saturation. This current sensor further has characteristics of simple construction, small volume, input and output electrical isolation, capability of measuring large DC and AC currents, adjustable measurement range, and low cost.

The embodiments of the present invention further provide a current sensor, which is different from the current sensors set forth in any of the above embodiments. Specifically, the current sensor provided by the present embodiment only adopts one current shunting copper bar.

Figure 11:
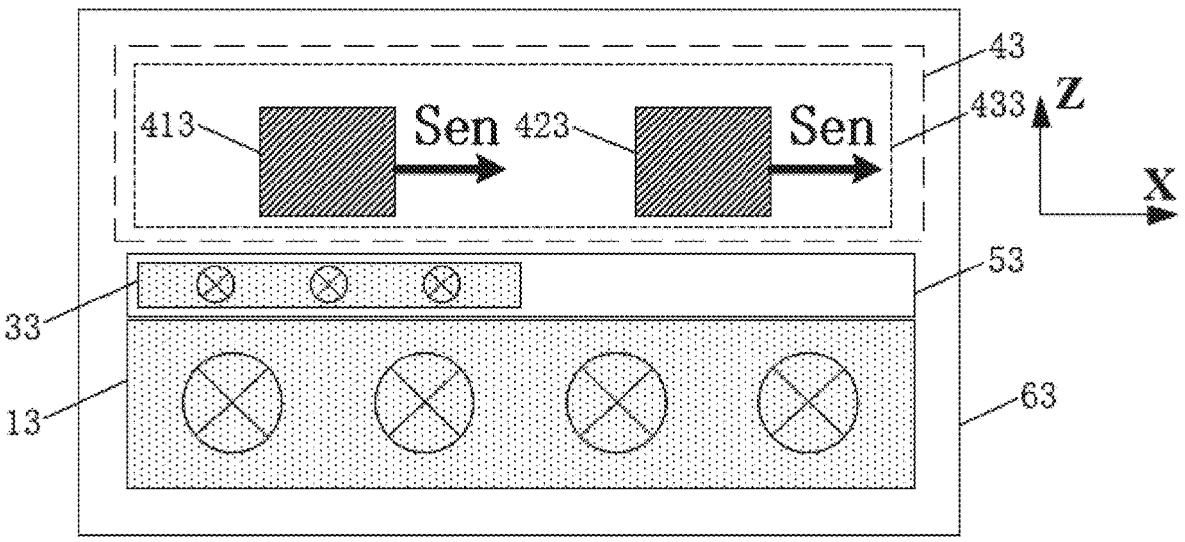
FIG. 11 is a schematic diagram of yet another current sensor according to an embodiment of the present invention.

Reference is made to FIG. 11, which is a schematic diagram of yet another current sensor according to an embodiment of the present invention. As shown in FIG. 11, the current sensor provided by the present embodiment comprises a to-be-measured current input component, composed of a current shunting copper bar 13 and a differential copper bar 33, the current shunting copper bar 13 and the differential copper bar 33 being arranged in the same direction; and a signal output component that is electrically isolated from said to-be-measured current input component and comprises a magnetic induction module 43 and a substrate 53, the magnetic induction module 43 being fixed on the substrate 53; wherein a current to be measured flows through a cross section perpendicular to the current shunting copper bar 13 and the differential copper bar 33, and generates a magnetic field at the position of the magnetic induction module 43; the magnetic induction module 43 at least comprises a first magnetic induction unit 413 and a second magnetic induction unit 423, the first magnetic induction unit 413 and the second magnetic induction unit 423 are located on the same horizontal plane, and the horizontal plane is parallel to the plane where the substrate 53 is located; the current shunting copper bar 13 is disposed under the differential copper bar 33 or above the magnetic induction module 43; in a direction perpendicular to the plane where the substrate 53 is located, the vertical projection of the differential copper bar 33 on the plane where the substrate 53 is located covers the first magnetic induction unit 413 and does not overlap with the second magnetic induction unit 423; the vertical projection of the current shunting copper bar 13 on the plane where the substrate 53 is located covers the first magnetic induction unit 413 and the second magnetic induction unit 423, and the first magnetic induction unit 413 and the second magnetic induction unit 423 sense, in a differential manner, a magnetic field generated by said to-be-measured current input component, and generate a differential voltage signal to form an output signal of the current sensor.

In the present embodiment, the cross sections of the current shunting copper bar 13 and the differential copper bar 33 are the X-Z plane, and the current to be measured flows through the copper bars in a direction perpendicular to the X-Z plane and generates a magnetic field. That is, the current direction of the current to be measured is perpendicular to the X-Z plane, and all the specific current directions are perpendicular to the paper and inward.

The magnetic induction module 43 at least comprises the first magnetic induction unit 413 and the second magnetic induction unit 423 therein. The first magnetic induction unit 413 and the second magnetic induction unit 423 are located on the same horizontal plane, the horizontal plane is parallel to the plane where the substrate 53 is located, and specifically, the first magnetic induction unit 413 and the second magnetic induction unit 423 are located above the substrate 53.

In the present embodiment, it is selected that the current shunting copper bar 13 is disposed under the differential copper bar 33, and the vertical projection of the current shunting copper bar 13 on the plane where the substrate 53 is located covers the first magnetic induction unit 413 and the second magnetic induction unit 423 in the Z direction; the differential copper bar 33 is arranged at one side inside the substrate 53 that is close to the first magnetic induction unit 413, and its vertical projection covers the first magnetic induction unit 413 and does not overlap with the second magnetic induction unit 423.

The first magnetic induction unit 413 and the second magnetic induction unit 423 sense, in a differential manner, a magnetic field generated when a current to be measured flows through said to-be-measured current input component, and generate a differential voltage signal, and at this point, the differential voltage signal output by the magnetic induction module 43 forms an output signal of the current sensor.

Optionally, the current sensor further comprises: a housing 63, wherein the to-be-measured current input component and the signal output component are both fixedly disposed inside the housing 63, and wherein the housing 63 is a mechanical support housing. The magnetic induction module 43 adopts an open-loop signal conditioning circuit 433. Optionally, the sensitivity direction of the first magnetic induction unit 413 is the same as the sensitivity direction of the second magnetic induction unit 423, which is the rightward X direction as shown in FIG. 11. By controlling the resistance and the series and parallel connection relationship of the current shunting copper bar 13 and the differential copper bar 33, most of the current can be caused to flow through the current shunting copper bar 13, thereby adjusting and expanding the measurement range of the current sensor. In addition, the connection manner in which the current shunting copper bar 13 and the differential copper bar 33 have opposite current directions may also be adopted to generate opposite magnetic fields at the magnetic induction module 43. In addition, it may also be selected that the differential copper bar 33 is disposed above the magnetic induction module 43, in which case the current shunting copper bar 13 and the differential copper bar 33 can similarly generate opposite magnetic fields at the magnetic induction module 43.

The present embodiment is a simplified version of the above embodiments with a simpler structure, smaller volume, and further reduced cost. By adjusting the position and structure of the to-be-measured current input component, the measurement range of the current sensor can be adjusted and expanded. There are characteristics of input and output electrical isolation, capability of measuring large DC and AC currents, adjustable measurement range, and low cost.

It should be noted that the above description is only preferred embodiments and the adopted technical principles of the present invention. A person skilled in the art shall appreciate that the present invention is not limited to the specific embodiments set forth herein, and to a person skilled in the art, various obvious modifications, re-adjustments, mutual combinations, and substitutions can be made without departing from the scope of protection of the present invention. Therefore, although the present invention has been described in detail through the above embodiments, the present invention is not merely limited to the above embodiments, and may further include more other equivalent embodiments without departing from the concept of the present invention, while the scope of the present invention is determined by the appended claims.

The invention claimed is:

1. A current sensor, comprising:

a to-be-measured current input component, composed of a first current shunting copper bar, a second current shunting copper bar, and a differential copper bar arranged between the first current shunting copper bar and the second current shunting copper bar, the first current shunting copper bar, the second current shunting copper bar, and the differential copper bar being arranged in the same direction; and a signal output component that is electrically isolated from said to-be-measured current input component and comprises a magnetic induction module and a substrate, the magnetic induction module being fixed on the substrate;

wherein a current to be measured flows through a cross section perpendicular to the first current shunting copper bar, the second current shunting copper bar, and the differential copper bar, and generates a magnetic field at the position of the magnetic induction module;

the magnetic induction module at least comprises a first magnetic induction unit and a second magnetic induction unit, the first magnetic induction unit and the second magnetic induction unit are located between the differential copper bar and the first current shunting copper bar, and the first magnetic induction unit and the second magnetic induction unit sense, in a differential manner, a differential mode magnetic field generated by said to-be-measured current input component, and generate a differential voltage signal to form an output signal of the current sensor; further comprising an open-loop signal conditioning circuit, wherein the open-loop signal conditioning circuit performs conditioning and amplification, temperature compensation, and linearity correction on the differential voltage signal; alternatively, further comprising a closed-loop signal conditioning circuit and a magnetic field feedback coil, wherein the closed-loop signal conditioning circuit, the magnetic field feedback coil, the first magnetic induction unit, and the second magnetic induction unit constitute a closed-loop magnetic field feedback structure; after being amplified by the closed-loop signal conditioning circuit, the differential voltage signal passes through the magnetic field feedback coil to generate a feedback magnetic field to reversely offset the differential mode magnetic field, the first magnetic induction unit and the second magnetic induction unit operate on equal common mode magnetic field working points when the magnetic field dynamic balance is achieved, and then the feedback current of the magnetic field feedback coil is sampled to form an output signal of the magnetic induction module.

2. The current sensor according to claim 1, wherein the first magnetic induction unit and the second magnetic induction unit are disposed on the same horizontal plane, and the horizontal plane is parallel to the plane where the substrate is located;

in a direction perpendicular to the plane where the substrate is located, the vertical projection of the differential copper bar on the plane where the substrate is located covers the first magnetic induction unit and does not overlap with the second magnetic induction unit;

in the direction perpendicular to the plane where the substrate is located, the vertical projection of the first current shunting copper bar on the plane where the substrate is located covers the first magnetic induction unit and the second magnetic induction unit, and the vertical projection of the second current shunting copper bar on the plane where the substrate is located covers the first magnetic induction unit and the second magnetic induction unit.

3. The current sensor according to claim 2, wherein the sensitivity direction of the first magnetic induction unit and the sensitivity direction of the second magnetic induction unit are the same as or opposite to the direction of the magnetic field generated by the current to be measured via the differential copper bar at the position of the first magnetic induction unit.

4. The current sensor according to claim 1, further comprising a housing, wherein the to-be-measured current input component and the signal output component are both fixedly disposed inside the housing.

5. The current sensor according to claim 1, wherein the differential copper bar is disposed inside the substrate.

6. The current sensor according to claim 1, wherein the first magnetic induction unit at least comprises one magnetoresistive bridge arm, and the second magnetic induction unit at least comprises one magnetoresistive bridge arm; the magnetoresistive bridge arm of the first magnetic induction unit and the magnetoresistive bridge arm of the second magnetic induction unit are electrically connected to form a differential half-bridge structure or a differential full-bridge structure, wherein all magnetoresistive bridge arms have the same sensitivity direction, and the magnetoresistive bridge arm is formed by connecting at least one magnetoresistive sensitive element in series and parallel.

7. The current sensor according to claim 1, wherein the magnetic field feedback coil is integrated and disposed inside the magnetic induction module; alternatively, the magnetic field feedback coil is integrated and disposed inside the substrate.

8. The current sensor according to claim 1, wherein the first magnetic induction unit comprises one first half bridge or first full bridge, and the second magnetic induction unit comprises one second half bridge or second full bridge; an output voltage difference between the bridge of the first magnetic induction unit and the bridge of the second magnetic induction unit generates the differential voltage signal.

9. The current sensor according to claim 8, wherein the first half bridge comprises two magnetoresistive bridge arms with opposite sensitivity directions, and the second half bridge comprises two magnetoresistive bridge arms with opposite sensitivity directions; alternatively, the first full bridge comprises four magnetoresistive bridge arms with two adjacent magnetoresistive bridge arms that are electrically connected having opposite sensitivity directions, and the second full bridge comprises four magnetoresistive bridge arms with two adjacent magnetoresistive bridge arms that are electrically connected having opposite sensitivity directions; wherein the magnetoresistive bridge arm is formed by one magnetoresistive sensitive element or by connecting more than one magnetoresistive sensitive element in series and parallel.

10. A current sensor, comprising:

a to-be-measured current input component, composed of a first current shunting copper bar and a second current shunting copper bar that are connected in parallel; and a signal output component that is electrically isolated from said to-be-measured current input component and comprises a magnetic induction module and a substrate, the magnetic induction module being fixed on the substrate;

wherein a current to be measured flows through a cross section perpendicular to the first current shunting copper bar and the second current shunting copper bar, and generates a magnetic field at the position of the magnetic induction module;

the magnetic induction module at least comprises a first magnetic induction unit and a second magnetic induction unit, the first magnetic induction unit is located between the first current shunting copper bar and the second current shunting copper bar, the first magnetic induction unit and the second magnetic induction unit are located on the same horizontal plane, the horizontal plane is parallel to the plane where the substrate is located, and in a direction perpendicular to the plane where the substrate is located, the vertical projection overlapping area of the first current shunting copper bar and the second current shunting copper bar on the plane where the substrate is located does not overlap with the second magnetic induction unit; and the first magnetic induction unit and the second magnetic induction unit sense, in a differential manner, a magnetic field generated by said to-be-measured current input component, and generate a differential voltage signal to form an output signal of the current sensor, further comprising an open-loop signal conditioning circuit, wherein the open-loop signal conditioning circuit performs conditioning and amplification, temperature compensation, and linearity correction on the differential voltage signal; alternatively, further comprising a closed-loop signal conditioning circuit and a magnetic field feedback coil, wherein the closed-loop signal conditioning circuit, the magnetic field feedback coil, the first magnetic induction unit, and the second magnetic induction unit constitute a closed-loop magnetic field feedback structure; after being amplified by the closed-loop signal conditioning circuit, the differential voltage signal passes through the magnetic field feedback coil to generate a feedback magnetic field to reversely offset the magnetic field, the first magnetic induction unit and the second magnetic induction unit operate on equal common mode magnetic field working points when the magnetic field dynamic balance is achieved, and then the feedback current of the magnetic field feedback coil is sampled to form an output signal of the magnetic induction module.

11. A current sensor, comprising:

a to-be-measured current input component, composed of a current shunting copper bar and a differential copper bar, the current shunting copper bar and the differential copper bar being arranged in the same direction; and a signal output component that is electrically isolated from said to-be-measured current input component and comprises a magnetic induction module and a substrate, the magnetic induction module being fixed on the substrate;

wherein a current to be measured flows through a cross section perpendicular to the current shunting copper bar and the differential copper bar, and generates a magnetic field at the position of the magnetic induction module;

the magnetic induction module at least comprises a first magnetic induction unit and a second magnetic induction unit, the first magnetic induction unit and the second magnetic induction unit are located on the same horizontal plane, and the horizontal plane is parallel to the plane where the substrate is located;

the current shunting copper bar is disposed under the differential copper bar or above the magnetic induction module; in a direction perpendicular to the plane where the substrate is located, the vertical projection of the differential copper bar on the plane where the substrate is located covers the first magnetic induction unit and does not overlap with the second magnetic induction unit; the vertical projection of the current shunting copper bar on the plane where the substrate is located covers the first magnetic induction unit and the second magnetic induction unit, and the first magnetic induction unit and the second magnetic induction unit sense, in a differential manner, a magnetic field generated by said to-be-measured current input component, and generate a differential voltage signal to form an output signal of the current sensor, further comprising an open-loop signal conditioning circuit, wherein the open-loop signal conditioning circuit performs conditioning and amplification, temperature compensation, and linearity correction on the differential voltage signal; alternatively, further comprising a closed-loop signal conditioning circuit and a magnetic field feedback coil, wherein the closed-loop signal conditioning circuit, the magnetic field feedback coil, the first magnetic induction unit, and the second magnetic induction unit constitute a closed-loop magnetic field feedback structure; after being amplified by the closed-loop signal conditioning circuit, the differential voltage signal passes through the magnetic field feedback coil to generate a feedback magnetic field to reversely offset the magnetic field, the first magnetic induction unit and the second magnetic induction unit operate on equal common mode magnetic field working points when the magnetic field dynamic balance is achieved, and then the feedback current of the magnetic field feedback coil is sampled to form an output signal of the magnetic induction module.

* * * * *